(12) United States Patent
Kim et al.

(10) Patent No.: US 11,081,271 B2
(45) Date of Patent: Aug. 3, 2021

(54) ELEMENT FOR PROTECTING CIRCUIT

(71) Applicant: MODA-INNOCHIPS CO., LTD., Ansan-Si (KR)

(72) Inventors: Gyeong Tae Kim, Ansan-Si (KR); Myung Ho Lee, Ansan-si (KR); Tae Geun Seo, Osan-si (KR); Heon Guk Ha, Seoul (KR); Jae Ho Han, Yangsan-si (KR)

(73) Assignee: MODA-INNOCHIPS CO., LTD.

( * ) Notice: Subject to any disclaimer, the term of this patent is extended or adjusted under 35 U.S.C. 154(b) by 291 days.

(21) Appl. No.: 16/092,999

(22) PCT Filed: May 15, 2017

(86) PCT No.: PCT/KR2017/005022
§ 371 (c)(1),
(2) Date: Oct. 11, 2018

(87) PCT Pub. No.: WO2017/200250
PCT Pub. Date: Nov. 23, 2017

(65) Prior Publication Data
US 2019/0122801 A1    Apr. 25, 2019

(30) Foreign Application Priority Data
May 16, 2016    (KR) .................. 10-2016-0059725

(51) Int. Cl.
*H01F 17/00* (2006.01)
*H01F 17/04* (2006.01)
(Continued)

(52) U.S. Cl.
CPC ......... *H01F 17/04* (2013.01); *H01F 17/0013* (2013.01); *H01F 27/29* (2013.01);
(Continued)

(58) Field of Classification Search
CPC .. H01F 17/0006; H01F 17/0013; H01F 17/04; H01F 27/2804; H01F 27/292;
(Continued)

(56) References Cited

U.S. PATENT DOCUMENTS 5,339,068 A * 8/1994 Tsunoda ............ H01C 1/02
338/308
6,710,694 B2 * 3/2004 Matsuta ............ H01F 17/0013
336/200
(Continued)

FOREIGN PATENT DOCUMENTS

EP    0550974 B1    7/1993
JP    2004072006 A    3/2004
(Continued)

OTHER PUBLICATIONS

European Search Report of European Patent Application No. 17799608.9, dated Oct. 9, 2019.
(Continued)

*Primary Examiner* — Tszfung J Chan
(74) *Attorney, Agent, or Firm* — Renaissance IP Law Group LLP

(57) ABSTRACT

The present disclosure discloses a circuit protection device including a first magnetic layer in which a plurality of magnetic sheets are laminated and of which at least a portion of one surface is exposed, a second magnetic layer in which a plurality of magnetic sheets are laminated and of which at least a portion of one surface is exposed, and a nonmagnetic layer in which a plurality of nonmagnetic sheets are laminated and which is disposed between the first and second magnetic layers. A noise filter part including a plurality of coil patterns is disposed in the nonmagnetic layer.

14 Claims, 13 Drawing Sheets

(51) Int. Cl.
*H01G 4/40* (2006.01)
*H01F 27/29* (2006.01)
*H01F 27/34* (2006.01)
*H01G 2/14* (2006.01)
*H01L 23/60* (2006.01)
*H03H 7/42* (2006.01)
*H03H 1/00* (2006.01)

(52) U.S. Cl.
CPC .......... *H01F 27/292* (2013.01); *H01F 27/34* (2013.01); *H01G 2/14* (2013.01); *H01G 4/40* (2013.01); *H01L 23/60* (2013.01); *H01F 2017/0026* (2013.01); *H01F 2017/0093* (2013.01); *H03H 7/427* (2013.01); *H03H 2001/0085* (2013.01)

(58) Field of Classification Search
CPC ........ H01F 27/32; H01F 27/323; H01F 27/34; H01F 2027/2809; H01G 2/14; H01G 4/40
USPC .................................................. 336/200, 232
See application file for complete search history.

(56) References Cited

U.S. PATENT DOCUMENTS

| | | | | |
|---|---|---|---|---|
| 7,633,735 B2 * | 12/2009 | Urakawa | ................... | H01T 4/12 361/112 |
| 2002/0030563 A1 * | 3/2002 | Nosaka | ................ | H03H 7/1775 333/185 |
| 2007/0030659 A1 * | 2/2007 | Suzuki | ................ | H01F 17/0013 361/793 |
| 2009/0128248 A1 | 5/2009 | Lee et al. | | |
| 2010/0001823 A1 | 1/2010 | Kawarai | | |
| 2010/0182116 A1 * | 7/2010 | Ishimoto | ............. | H01F 17/0006 336/192 |
| 2011/0007439 A1 * | 1/2011 | Asakawa | ............. | H03H 7/0107 361/56 |
| 2013/0141826 A1 | 6/2013 | Asakura et al. | | |
| 2013/0201585 A1 * | 8/2013 | Ikeda | ........................ | H01T 4/12 361/56 |
| 2014/0247102 A1 | 9/2014 | Kurobe | | |
| 2014/0306787 A1 | 10/2014 | Kato et al. | | |
| 2014/0340812 A1 | 11/2014 | Sumi et al. | | |
| 2014/0347773 A1 * | 11/2014 | Park | ........................ | H02H 9/005 361/56 |
| 2015/0280682 A1 * | 10/2015 | Park | .......................... | H05F 3/04 361/220 |
| 2017/0092414 A1 * | 3/2017 | Ishikawa | ............... | H01F 27/245 |

FOREIGN PATENT DOCUMENTS

| | | | | |
|---|---|---|---|---|
| JP | 2007200923 A | * | 8/2007 | |
| JP | 2007200923 A | | 8/2007 | |
| JP | 2013038207 A | | 2/2013 | |
| JP | 2014230278 A | | 12/2014 | |
| JP | 2015204337 A | * | 11/2015 | |
| JP | 2015204337 A | | 11/2015 | |
| KR | 20070061784 A | | 6/2007 | |
| KR | 100876206 B1 | | 12/2008 | |
| KR | 20130117397 A | | 10/2013 | |
| TW | 200701636 A | | 1/2007 | |
| TW | 201448456 A | | 12/2014 | |
| TW | 201537891 A | | 10/2015 | |
| TW | 201541478 A | | 11/2015 | |
| WO | 2009045008 A2 | | 4/2009 | |
| WO | WO-2009045008 A2 | * | 4/2009 | ........... H01L 23/552 |

OTHER PUBLICATIONS

International Search Report for PCT/KR2017/005022 dated Aug. 25, 2017.
Written Opinion for PCT/KR2017/005022 dated Aug. 25, 2017.
Office Action for European Patent Application Serial No. 17799608.9, dated Apr. 19, 2021.

* cited by examiner

510 : 510a, 510b
510a : 511a, 513a
510b : 511b, 513b
520 : 520a, 520b
530 : 531, 532

510 : 512, 514
530 : 533, 534

E-E'

ELEMENT FOR PROTECTING CIRCUIT

TECHNICAL FIELD

The present disclosure relates to a circuit protection device, and more particularly, to a circuit protection device that is capable of being reduced in thickness and improved in reliability.

BACKGROUND

In recent years, with the multifunctionality of portable electronic devices, for example, smartphones, various frequency bands are being used. That is, a plurality of functions using different frequency bands such as wireless LAN, Bluetooth, and GPS in one smartphone have been adopted. Also, as electronic devices are highly integrated, internal circuit density in a limited space increases, and thus, noise interference necessarily occurs between the internal circuits. For example, a noise having a frequency of 750 MHz deteriorates communication quality of smartphones, and noise having a frequency of 1.5 GHz deteriorates quality of GPS.

A plurality of circuit protection devices for suppressing noises having various frequencies of the portable electronic devices and noises between the internal circuits are being used. For example, a condenser, a chip bead, a common mode filter, and the like, which respectively remove noises having frequency bands different from each other, are being used. Here, the common mode filter may have a structure in which two choke coils are combined with each other to form one body and may allow signal current of a differential mode to pass therethrough and remove only noise current of a common mode. That is, the common mode filter may classify and remove the signal current of the differential mode, which is AC current, and the noise current of the common mode.

Also, an ESD protection device for protecting an electronic device from a high voltage such as ESD, which is applied to the electronic device from the outside, is required. However, when the common mode noise filter and the ESD protection device are separately mounted, areas occupied by the common mode noise filter and the ESD protection device may increase. Thus, the common mode noise filter and the ESD protection device are laminated in one chip to realize the circuit protection device. Here, the common mode noise filter and the ESD protection device may be realized on a nonmagnetic ceramic sheet. Also, a separation layer using a magnetic ceramic sheet is disposed between the common mode noise filter and the ESD protection device, and upper and lower cover layers using a magnetic sheet are respectively disposed above and below the common mode noise filter and the ESD protection device. Thus, the magnetic upper cover layer, the nonmagnetic common mode noise filter, the magnetic separation layer, the nonmagnetic ESD protection device, and the magnetic lower cover layer are laminated to form the circuit protection device. Here, each of the layers may be formed by laminating a nonmagnetic sheet or magnetic sheet having a predetermined thickness. Also, a surface layer provided as a glassy sheet is further formed on a surface of each of the upper and lower magnetic cover layers.

As described above, since the five layers having magnetic properties different from each other are alternately laminated, the circuit protection device increases in thickness. Thus, there is a limitation in reducing the thickness of the circuit protection device in accordance with the reduction in size and mounting area.

PRIOR ART DOCUMENT

Korean Patent Registration No. 10-0876206

DISCLOSURE

Technical Problem

The present disclosure provides a circuit protection device that is capable of being reduced in thickness.

The present disclosure provides a circuit protection device in which a nonmagnetic layer is disposed between first and second magnetic layers.

The present disclosure provides a circuit protection device in which a noise filter part is disposed on a nonmagnetic layer, and an ESD protection part is disposed on a magnetic layer.

Technical Solution

In accordance with an exemplary embodiment, a circuit protection device includes: a first magnetic layer in which a plurality of magnetic sheets are laminated and of which at least a portion of one surface is exposed; a second magnetic layer in which a plurality of magnetic sheets are laminated and of which at least a portion of one surface is exposed; and a nonmagnetic layer in which a plurality of nonmagnetic sheets are laminated and which is disposed between the first and second magnetic layers, wherein a noise filter part including a plurality of coil patterns is disposed in the nonmagnetic layer.

At least one of the first and second magnetic layers and the nonmagnetic layer may have a different thickness.

At least one of the plurality of magnetic sheets and the plurality of nonmagnetic sheets may have a different thickness.

The noise filter part may include a plurality of coil patterns, a plurality of lead-out electrodes, and a plurality of connection electrodes, which are disposed on the nonmagnetic sheet selected from the plurality of nonmagnetic sheets.

At least two coil patterns disposed on the sheets different from each other may be connected to the connection electrode to constitute one inductor, and the inductor may be provided in plurality.

The circuit protection device may further include an ESD protection part including first and second internal electrodes disposed on at least one of the first and second magnetic layer and an ESD protection member disposed between the first and second internal electrodes.

The first and second internal electrodes may be vertically spaced apart from each other, and the ESD protection member may be disposed between the first and second internal electrodes.

The first and second internal electrodes may be horizontally spaced apart from each other, and the ESD protection member may be disposed between the first and second internal electrodes.

The ESD protection member may be formed by using at least one of a porous insulation material, a conductive material, and a pore.

At least one of a thickness and a width of the ESD protection member on at least one area may be different from that of the ESD protection member on the other area.

A thickness of each of the first and second internal electrodes on at least one area may be different from that of each of the first and second internal electrodes on the other area.

The circuit protection device may further include a discharge induction layer between the first and second internal electrodes and the ESD protection member.

A distance between the coil pattern and the internal electrode adjacent to the coil pattern may be equal to or greater than that between the two coil patterns adjacent to each other.

The ESD protection member may have a thickness equal to or greater than the distance between the two coil patterns adjacent to each other.

The first internal electrode may overlap at least a portion of the lead-out electrode of the noise filter part, and the second internal electrode may be disposed in a direction perpendicular to that in which the first internal electrode is disposed.

The circuit protection device may further include at least one nonmagnetic sheet which is disposed between at least two coil patterns and on which at least one capacitor electrode is disposed.

The circuit protection device may further include a plurality of first external electrodes connected to the lead-out electrode of the noise filter part and the first internal electrode of the ESD protection part and a plurality of second external electrodes connected to the second internal electrodes of the ESD protection part.

The circuit protection device may further include an insulation member disposed on a surface of a laminate to expose at least a portion of the surface of the laminate.

The circuit protection device may further include a recess part defined in at least a portion of the surface of the laminate.

The insulation member may be made of oxide having a crystal state or amorphous state.

The oxide may include at least one of $Bi_2O_3$, $BO_2$, $B_2O_3$, ZnO, $Co_3O_4$, $SiO_2$, $Al_2O_3$, MnO, $H_2BO_3$, $H_2BO_3$, $Ca(CO_3)_2$, $Ca(NO_3)_2$, and $CaCO_3$.

In accordance with another exemplary embodiment, a circuit protection device includes: a laminate in which a plurality of insulation sheets are laminated; a noise filter part disposed in the laminate; and oxide disposed on at least one surface of the laminate to expose at least a portion of the surface of the laminate.

The oxide may include at least one of $Bi_2O_3$, $BO_2$, $B_2O_3$, ZnO, $Co_3O_4$, $SiO_2$, $Al_2O_3$, MnO, $H_2BO_3$, $H_2BO_3$, $Ca(CO_3)_2$, $Ca(NO_3)_2$, and $CaCO_3$, which are in a crystal state or non-crystal state.

The laminate may include first and second magnetic layers and a nonmagnetic layer disposed between the first and second magnetic layers, and a noise filter part including a plurality of coil patterns may be disposed in the nonmagnetic layer.

The circuit protection device may further include an ESD protection part disposed on at least one of the first and second magnetic layers, wherein the ESD protection part may include first and second internal electrodes vertically or horizontally spaced apart from each other and an ESD protection member disposed between the first and second internal electrodes.

The ESD protection member may be formed by using at least of a porous insulation material, a conductive material, and a pore.

Advantageous Effects

In the circuit protection device in accordance with the embodiments, the nonmagnetic layer formed by laminating the plurality of nonmagnetic sheets between the first and second magnetic layers, which are formed by laminating the plurality of magnetic sheets, may be provided, and the noise filter part including the plurality of coil patterns may be disposed in the nonmagnetic layer. Also, the ESD protection part for protecting the circuit from the ESD voltage may be disposed in at least one of the first and second magnetic layers.

Thus, the ESD protection part may be disposed in the magnetic layer, and the glassy layer may not be disposed on the surface to reduce the thickness of the device. Therefore, since the device is reduced in size, the circuit protection device may be mounted to correspond to the electronic device that is reduced in mounting area and height.

Also, since the glassy layer is not disposed on the surface, and the ESD protection part is disposed in the magnetic layer, the reliability may be improved. That is, when the glassy layer is disposed on the surface, the glassy layer may absorb the moisture to deteriorate the reliability of the device. However, the glassy layer may not be disposed on the surface, and the ESD protection part may be disposed in the magnetic layer to improve the moisture property, thereby improving the reliability.

BRIEF DESCRIPTION OF THE DRAWINGS

Exemplary embodiments can be understood in more detail from the following description taken in conjunction with the accompanying drawings, in which.

MODE FOR CARRYING OUT THE INVENTION

Figure 1:
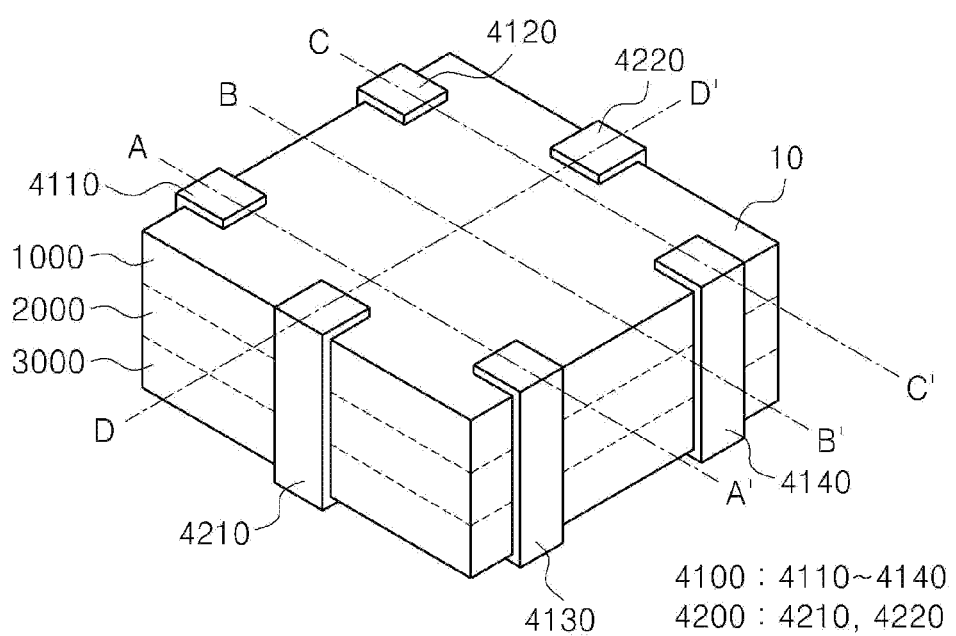
FIG. 1 is a coupling perspective of a circuit protection device in accordance with an exemplary embodiment.

Hereinafter, specific embodiments will be described in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. In the figures, the dimensions of layers and regions are exaggerated for clarity of illustration. Like reference numerals refer to like elements throughout.

Figure 6:
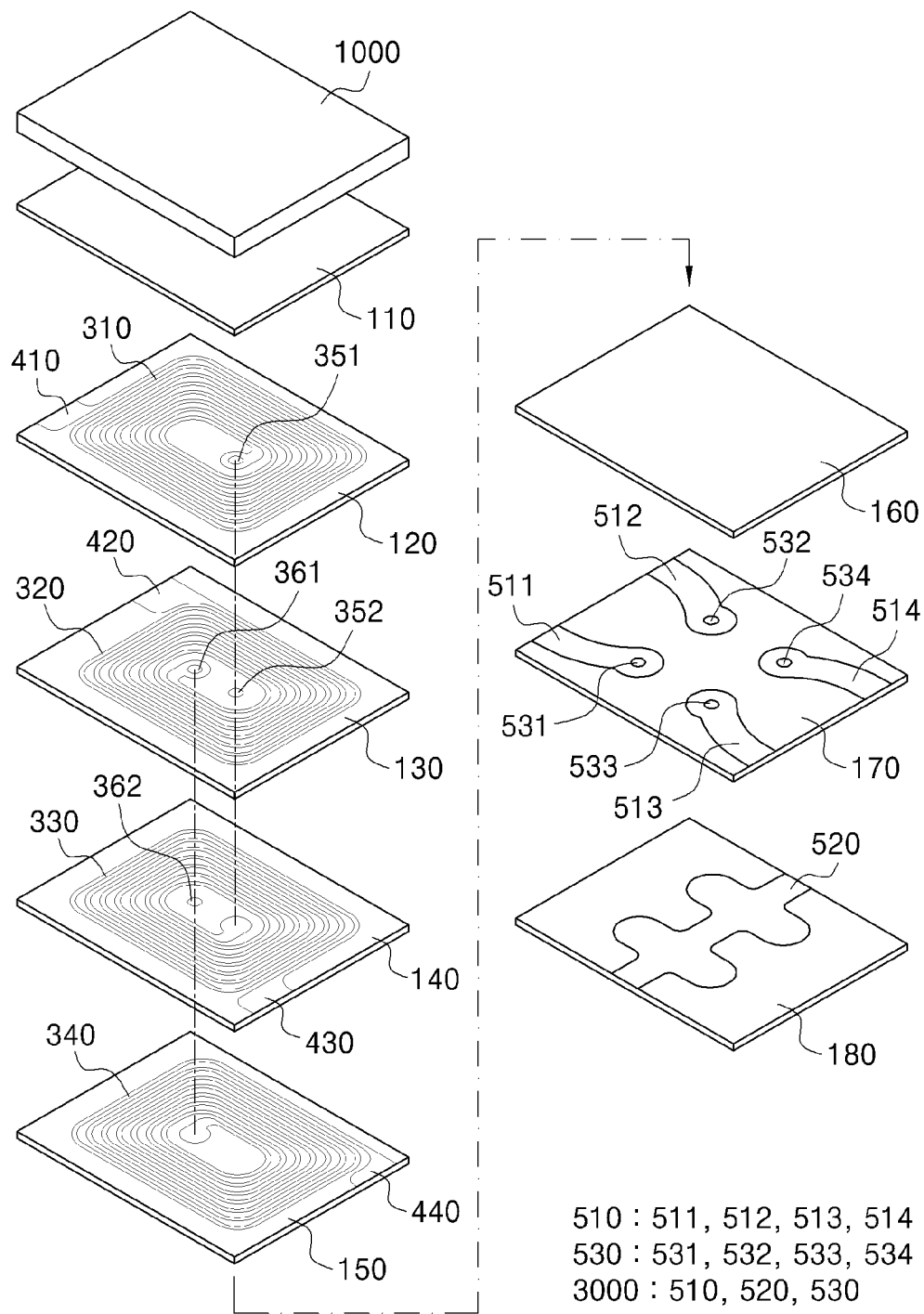
FIG. 6 is an exploded perspective view of the circuit protection device in accordance with an exemplary embodiment.

FIG. 1 is a coupling perspective of a circuit protection device in accordance with an exemplary embodiment, FIGS. 2 to 5 are cross-sectional views of the circuit protection device in accordance with an exemplary embodiment, and FIG. 6 is an exploded perspective view of the circuit protection device in accordance with an exemplary embodiment.

The circuit protection device in accordance with an exemplary embodiment may include first and second magnetic layers in which a plurality of magnetic sheets are laminated and a nonmagnetic layer in which a plurality of nonmagnetic sheets are laminated and which is disposed between the first and second magnetic layers. Also, a noise filter part for removing a noise may be disposed in the nonmagnetic layer, and an ESD protection part for protecting the device from an ESD voltage may be disposed in at least one of the first and second magnetic layers. For example, referring to FIGS. 1 to 6, a plurality of sheets may be laminated to constitute the circuit protection device including a cover layer 1000, a noise filter part 2000, and an ESD protection part 3000. Here, the noise filter part 2000 may include a common mode noise filter, and the cover layer 1000 may be disposed on an upper or lower portion of the noise filter part 2000. That is, the cover layer 1000 may be disposed on the upper portion of the noise filter part 2000, and the ESD protection part 3000 may be disposed on the lower portion of the noise filter part 2000. Alternatively, the ESD protection part 3000 may be disposed on the upper portion of the noise filter part 2000, and the cover layer 1000 may be disposed on the lower portion of the noise filter part 2000. Here, at least a portion of a top surface of the cover layer 1000 and a bottom surface of the ESD protection part 300 may be exposed. That is, oxide having a particle state or a molten state may be dispersed on surfaces of the cover layer 1000 and the ESD protection part 3000. Thus, at least a portion of the surface may be oxidized, and the oxide may not be dispersed on at least a portion of the surface, and at least a portion of the surface may not be dispersed and thus be exposed. Here, the oxide may be dispersed on a side surface of a laminate 10 in which the cover layer 1000, the noise filter part 2000, and the ESD protection part 3000 are laminated. As a result, in accordance with an exemplary embodiment, the oxide having the particle state or the molten state may be dispersed on the top and bottom surfaces and the side surface of the laminate 10. Thus, a glassy layer is not disposed on the surface, and the oxide having the particle state or the molted state is dispersed on at least a portion of the surface so that at least a portion of the surface is exposed. Also, the circuit protection device may further include first external electrodes 4100 (4110, 4120, 4130, and 4140) disposed on first and second side surfaces, which face each other, of the laminate 10, in which the cover layer 1000, the noise filter part 2000, and the ESD protection part 3000 are laminated, and second external electrodes 4200 (4210 and 4220) disposed n third and fourth side surfaces which face each other and on which the first external electrode 4100 is not disposed. Here, since the glassy layer is not disposed on the surface, and the oxide is disposed on at least a portion of the surface, the first and second external electrodes 4100 and 4200 may be easily formed. Here, the first external electrodes 4100 may be connected to the noise filter part 2000 and the ESD protection part 3000, and the second external electrodes 4200 may be connected to the ESD protection part 3000. Also, the plurality of sheets of each of the cover layer 1000 and the ESD protection part 3000 may include magnetic sheets, and the plurality of sheets of the noise filter part 2000 may include nonmagnetic sheets. That is, the cover layer 1000 may be provided as a plurality of magnetic sheets, and the ESD protection part 3000 may be disposed on the plurality of magnetic sheets. The noise filter part 2000 may be disposed on a plurality of nonmagnetic sheets. Thus, in the circuit protection device in accordance with an exemplary embodiment, a magnetic layer may be disposed between two nonmagnetic layers, the noise filter part 2000 may be disposed in the magnetic layer, and the ESD protection part 3000 may be disposed in at least one of the nonmagnetic layers. Here, the magnetic sheet may be formed by using, for example, NiZnCu or NiZn-based magnetic ceramic. For example, the NiZnCu-based magnetic sheet may be formed by mixing $Fe_2O_3$, ZnO, NiO, and CuO. Here, $Fe_2O_3$, ZnO, NiO, and CuO may be mixed at, for example, a ratio of 5:2:2:1. Also, the nonmagnetic sheet may be manufactured by using, for example, low temperature co-fired ceramic (LTCC).

Cover Layer

The cover layer 1000 may be disposed on one surface of the noise filter part 2000. For example, the cover layer 1000 may be disposed above the noise filter part 2000. A plurality of sheets may be laminated to form the cover layer 1000 having a predetermined thickness. Here, a plurality of sheets, each of which has the same shape as each of the sheets constituting the noise filter part 2000 and the ESD protection part 3000, may be laminated to form the cover layer 1000. For example, a plurality of sheets, each of which has an approximately rectangular plate shape with a predetermined thickness, may be laminated to form the cover layer 1000. Here, each of the sheets constituting the cover layer 1000 may have the same thickness as or equal to or less than that of each of the sheets constituting the noise filter part 2000 and the ESD protection part 3000. For example, each of the sheets constituting the cover layer 1000 may have a thickness greater than that of each of the sheets constituting the noise filer part 2000 and the same thickness as that of each of the sheets constituting the ESD protection part 3000. Also, the cover layer 1000 may have the same thickness as that of each of the noise filter part 2000 and the ESD protection part 3000 or a thickness less or greater than that of each of the noise filter part 2000 and the ESD protection part 3000. For example, the cover layer 1000 may have the same thickness as that of the noise filter part 2000 by laminating the sheets having numbers less than those of sheets of the noise filter part 2000. Also, the cover layer 1000 may have the same thickness as that of the noise filter part 2000 by laminating the sheets having the same number as that of sheets of the noise filter part 2000. Alternatively, the cover layer 1000 may have a thickness greater than that of the noise filter part 2000. Also, the cover layer 1000 may have the same thickness as that of the ESD protection part 3000 by laminating the sheets having the same number as that of sheets of the ESD protection part 3000 or may have a thickness less or greater than that of the ESD protection part 3000 by laminating the sheets having numbers less or greater than that of sheets of the ESD protection part 3000.

Noise Filter Part

Referring to FIGS. 2 to 6, in the noise filter part 2000, a plurality of sheets 110 to 150 may be laminated, and a lead-out electrode, a coil pattern, and a hole in which a conductive material is filled may be selectively formed on or in the plurality of sheets 110 to 150. That is, the noise filter part 2000 may include a plurality of sheets 110 to 150, each of which is made of a nonmagnetic material, a plurality of holes 351, 352, 361, and 362 which are selectively defined in the plurality of sheets 120 to 150 and in which a conductive material is filled, coil patterns 310, 320, 330, and 340 disposed on the selected sheets 120 to 150, and lead-out electrodes 410, 420, 430, and 440 disposed on the selected sheets 120 to 150 and connected to the coil patterns 310, 320, 330, and 340 to lead out. Here, the plurality of holes 351, 352, 353, 361, 362, 363 in which the conductive material is filled may form vertical connection lines 350 and 360. That is, the plurality of holes 351, 352, and 353 may form the vertical connection line 350, and the plurality of holes 361, 362, and 363 may form the vertical connection line 360. The plurality of sheets 110 to 150 constituting the noise filter part 2000 may have the same shape, for example, rectangular plate shapes and the same thickness. Alternatively, at least one of the plurality of sheets 110 to 150 may have a different thickness. The configuration of the noise filter part 200 will be described below in more detail.

The sheet 110 may have an approximately rectangular plate shape with a predetermined thickness. The sheet 110 may be disposed on the sheets 120, 130, 140, and 150 on which the coil patterns 310, 320, 330, and 340 are disposed.

The hole 351 in which the conductive material is filled, the first coil pattern 310, and the first lead-out electrode 410 are disposed on the sheet 120. The sheet 120 may have an approximately rectangular plate shape with a predetermined thickness. That is, the sheet 120 may have a square shape or a rectangular shape. The hole 351 may be defined in a predetermined area that is spaced apart from an exact center of the sheet 120 in one direction. The exact center may be defined as a point at which two diagonal lines meet each other when virtual lines are diagonally drawn from four edges. For example, the sheet 120 may have the rectangular shape, and the hole 351 may be defined at a point that is spaced a predetermined distance from the exact center of the sheet 120 in one side direction, for example, a direction in which external electrodes 5120 and 5140 are disposed. The conductive material may be filled in the hole 351. For example, the hole 351 may be filled with paste of a metal material. Also, the first coil pattern 310 may have a predetermined turn number by rotating from the hole 351 in one direction. For example, the first coil pattern 310 may have a turn number of 3 to 7.5. Here, the first coil pattern 310 may be disposed without passing through a central area of the sheet 120. For example, the first coil pattern 310 may have a predetermined width and distance and a spiral shape that rotates outward in a counterclockwise direction. Here, the first coil pattern 310 may have the same line width and distance. Also, the first coil pattern 310 has an end connected to the first lead-out electrode 410. The first lead-out electrode 410 has a predetermined width and is exposed to one side of the sheet 120. For example, the first lead-out electrode 410 extends in one side direction of the sheet 120, i.e., is disposed to be exposed to one side of the sheet 120 in a direction opposite to that, in which the hole 351 is defined, at the exact center of the sheet 120. Thus, the first lead-out electrode 410 is connected to the first external electrode 4110. Here, the first lead-out electrode 410 may have a width greater than that of the first coil pattern 310 and thus increase a contact area with the first external electrode 4110 to prevent resistance from increasing.

The two holes 352 and 361, the second coil pattern 320, and the second lead-out electrode 420 may be provided in or on the sheet 130. The sheet 130 may have the same shape as that of each of the sheets 110 and 120. Here, the sheet 130 may have the same thickness as that of each of the sheets 110 and 120 or have a thickness greater than that of each of the sheets 110 and 120. When the sheet 130 has a thickness greater than that of each of the sheets 110 and 120, the sheet 130 may have a thickness greater 1.1 times to 2 times than that of each of the sheets 110 and 120. The hole 352 may pass through the sheet 130 and be defined in a central area of the sheet 130. Here, the hole 352 may be defined at the same position as that of the hole 351 defined in the sheet 120. Also, the hole 361 may be defined in a predetermined area that is spaced apart from the exact center in the other direction at the same distance as that by which the hole 352 is spaced apart from the exact center. That is, the two holes 352 and 361 may be defined at the same distance with respect to the exact center. The conductive material may be filled in the holes 352 and 361. For example, the holes 351 and 361 may be filled with paste of a metal material. Also, the hole 352 may be connected to the conductive material filled in the hole 351 of the sheet 120 by the conductive material thereof. Also, the second coil pattern 320 may have a predetermined turn number by rotating from the hole 361 in one direction. For example, the second coil pattern 320 may have a turn number less than that of the first coil pattern 310, for example, a turn number of 2.5 to 7. Here, the second coil pattern 320 may be disposed without passing through the central area of the sheet 130 and the hole 352. For example, the second coil pattern 320 may have a predetermined width and distance and a spiral shape that rotates outward in a counterclockwise direction. That is, the second coil pattern 320 may rotate in the same direction as the rotating direction of the first coil pattern 310 disposed on the sheet 120. Also, the second coil pattern 320 has an end connected to the second lead-out electrode 420. The second lead-out electrode 420 may have a width greater than that of the second coil pattern 320 and be exposed to one side of the sheet 130. Here, the second lead-out electrode 420 may be spaced a predetermined distance from the first lead-out electrode 410 disposed on the sheet 120 and be exposed in the same direction as that in which the first lead-out electrode is exposed. The second lead-out electrode 420 may be connected to the first external electrode 4120. That is, the lead-out electrodes 410 and 420 of the sheets 120 and 130 may be spaced apart from each other and exposed in the same direction and thus respectively connected to the first external electrodes 4110 and 4120.

The hole 362, the third coil pattern 330, and the third lead-out electrode 430 may be provided in or on the sheet 140. The sheet 140 may have an approximately rectangular plate shape with a predetermined thickness. The hole 362 may pass through the sheet 140 and be defined in a central area of the sheet 140. Here, the hole 362 may be defined at the same position as that of the hole 361 defined in the sheet 130. The conductive material may be filled in the hole 362. For example, the hole 362 may be filled with paste of a metal material and thus be connected to the hole 361 of the sheet 130. Also, the third coil pattern 330 may have a predetermined turn number by rotating from an area spaced a predetermined distance from the hole 362 in one direction. That is, the third coil pattern 330 may be defined in a predetermined area that is spaced apart from the exact center in the other direction at the same distance as that by which the hole 362 is spaced apart from the exact center of the sheet 140. That is, the third coil pattern 330 may be defined at the same position as that of the hole defined in the sheet 130. Also, the third coil pattern 330 may have the same turn number as that of the second coil pattern 320, for example, a turn number of 2.5 to 7. Here, the third coil pattern 330 may be disposed without passing through the central area of the sheet 140 and the hole 362. For example, the third coil pattern 330 may have a predetermined width and distance and a spiral shape that rotates outward in a clockwise direction. That is, the third coil pattern 330 may rotate in a direction opposite to the rotating direction of each of the coil patterns 310 and 320 disposed on the sheet 120 and 130. Also, the third coil pattern 330 has an end connected to the third lead-out electrode 430. The third lead-out electrode 430 has a predetermined width and is exposed to one side of the sheet 140. Here, the third lead-out electrode 430 may be exposed to a surface opposite to that of the first lead-out electrode 410 disposed on the sheet 120. Also, the third lead-out electrode 430 may be disposed in a line with the first lead-out electrode 410 disposed on the sheet 120. The third lead-out electrode 430 may be connected to the first external electrode 4130.

The fourth coil pattern 340 and the fourth lead-out electrode 440 may be disposed on the sheet 150. The sheet 150 may have an approximately rectangular plate shape with a predetermined thickness. The fourth coil pattern 340 may have a predetermined turn number by rotating form a predetermined area of the sheet 150 in one direction. For example, the fourth coil pattern 340 may have the same turn number as that of the first coil pattern 310 from an area thereof overlapping the area of the sheet 140 in which the hole 362 is defined. For example, the fourth coil pattern 340 may have a turn number of 3 to 7.5. Here, the fourth coil pattern 340 may be disposed without passing through a central area of the sheet 150. Also, the fourth coil pattern 340 may have a predetermined width and distance and a spiral shape that rotates outward in a clockwise direction. The fourth coil pattern 340 has an end connected to the fourth lead-out electrode 440. The fourth lead-out electrode 440 has a predetermined width and is exposed to one side of the sheet 150. For example, the fourth lead-out electrode 440 extends in one side direction of the sheet 150, is spaced a predetermined distance from the third lead-out electrode 430 disposed on the sheet 140, and is disposed in a line with the second lead-out electrode 420 disposed on the sheet 130. The fourth lead-out electrode 440 may be connected to the first external electrode 4140.

Also, in the noise filter part 2000, the first coil pattern 310 of the sheet 120 is connected to the third coil pattern 330 of the sheet 140 by the vertical connection electrode 350, and the second coil pattern 320 of the sheet 130 is connected to the fourth coil pattern 340 of the sheet 150 by the vertical connection electrode 360. That is, the first coil pattern 310 and the third coil pattern 330 may be connected to each other, and the second coil pattern 320 and the fourth coil pattern 340 may be connected to each other. Thus, in the circuit protection device in accordance with an exemplary embodiment, the first coil pattern 310 and the third coil pattern 330 connected to the first coil pattern 310 constitute a first inductor, and the second coil pattern 320 and the fourth coil pattern 340 connected to the second coil pattern 320 constitute a second inductor. Also, in the noise filter part 2000, the first and fourth coil patterns 310 and 340 may have the same turn number, and the second and third coil patterns 320 and 330 may have the same turn number. Here, each of the first and fourth coil patterns 310 and 340 may have a turn number different from that of each of the second and third coil patterns 320 and 330. For example, each of the first and fourth coil patterns 310 and 340 may have a turn number greater than that of each of the second and third coil patterns 320 and 330. That is, one of the two coil patterns constituting the first inductor and one of the two patterns constituting the second inductor may have the same turn number and may have turn numbers greater than those of other coil patterns constituting the first and second inductors. Here, other coil patterns constituting the first and second inductors may have the same turn number. For example, each of the first and fourth coil patterns 310 and 340 may have a turn number of 3 to 7.5, and each of the second and third coil patterns 320 and 330 may have a turn number of 2.5 to 7. Particularly, each of the first and fourth coil patterns 310 and 340 may have a turn number of 3, 4.5, 6.5, or 7.5, and each of the second and third coil patterns 320 and 330 may have a turn number of 2.5, 4, 6 or 7. However, since the first and third coil patterns 310 and 330 are connected to each other to constitute the first inductor, and the second and fourth coil patterns 320 and 340 are connected to each other to constitute the second inductor, the total coil patterns of the first and second inductors may have the same turn number. Also, the first to fourth coil patterns 310, 320, 330, and 340 may have lengths different from each other. That is, although the coil patterns have the same turn number, the coil patterns may have lengths different from each other.

In the circuit protection device in accordance with an exemplary embodiment, the first coil pattern 310 and the third coil pattern 330 of the noise filter part 2000 may be connected to each other to constitute the first inductor, and the second coil pattern 320 and the fourth coil pattern 340 may be connected to each other to constitute the second inductor. That is, odd-numbered coil patterns may be connected to each other, and even-numbered coil patterns may be connected to each other. However, the first coil pattern 310 and the fourth coil pattern 340 may be connected to each other to constitute the first inductor, and the second coil pattern 320 and the third coil pattern 330 may be connected to each other to constitute the second inductor. That is, the outer coil patterns may be connected to each other in a vertical direction, and the inner coil patterns may be connected to each other in the vertical direction. Here, the first and third coil patterns 310 and 330 may have the same turn number, the second and fourth coil patterns 320 and 340 may have he same turn number, and each of the first and third coil patterns 310 and 330 may have a turn number different from that of each of the second and fourth coil patterns 320 and 340.

Also, although the four coil patterns are provided, and the coil patterns are connected to each other by two to constitute the inductors in accordance with an exemplary embodiment, four or more coil patterns may be provided, and the coil patterns may be connected to each other by three or more to realize the inductors. Alternatively, the plurality of coil pattern may be provided, and the coil patterns may be connected to each other by two to realize at least three inductors. Also, the plurality of inductors may have the same inductance, or at least one inductor may have a different inductance. To allow the inductors to have inductances different from each other, the coil patterns may have turn numbers different from each other.

ESD Protection Part

The ESD protection part 3000 may be formed by laminating a plurality of sheets 160, 170, and 180 on which the internal electrodes 510 and 520 and an ESD protection member 530 are selectively disposed. Here, the sheets 160, 170, and 180 may have the same thickness, or at least one sheet may have a different thickness.

The sheet 160 may have the same shape as that of each of the sheets 110 to 150 of the noise filter part 2000, i.e., an approximately rectangular plate shape. Here, the sheet 160 may have the same thickness as that of each of the sheets 110 to 150 of the noise filter part or have a different thickness. For example, the sheet 160 may have a thickness greater than that of each of the sheets 110 to 150 of the noise filter part 2000. Thus, a distance between the first internal electrode 510 disposed on the sheet 170 and the fourth coil pattern 340 disposed on the sheet 150 may be greater than that between the noise filter part 2000 and each of the coil patterns 310, 320, 330, and 340.

The sheet 170 may have the same shape as that of the sheet 160 and may have a thickness greater than that of each of the sheets 110 to 150 of the noise filter part 2000. A plurality of first internal electrodes 510 (511, 512, 513, and 514) may be disposed on a top surface of the sheet 170. The plurality of first internal electrodes 510 may be disposed at the same position as that of the lead-out electrode 400 of the noise filter part 2000. That is, a first-1 internal electrode 511 may overlap the first lead-out electrode 410, a first-2 internal electrode 512 may overlap the second lead-out electrode 420, a first-3 internal electrode may overlap the third lead-out electrode 430, and a first-4 internal electrode 514 may overlap the fourth lead-out electrode 440. Thus, the first internal electrode 510 is connected to the first external electrode 4100 together with the lead-out electrode 400 of the noise filter part 2000. Also, a plurality of ESD protection members 530 (531, 532, 533, and 534) may be disposed on the sheet 170. The plurality of ESD protection members 530 may be disposed on ends of the plurality of first internal electrodes 510, respectively. That is, a hole passing through the sheet 170 may be defined in each of ends of the plurality of first internal electrodes 510. An ESD protection material may be filled into or applied to each of the holes to form the ESD protection members 530. For example, each of the ESD protection members 530 may be formed by applying the ESD protection material to a side surface of the hole defined in the sheet 170, or the ESD protection material may be applied to or filled into at least a portion of the hole to form each of the ESD protection members 530. The ESD protection material may be made of at least one conductive material selected from $RuO_2$, Pt, Pd, Ag, Au, Ni, Cr, W, and the like. To form the ESD protection member 530 by using the conductive material, the conductive material may be mixed with an organic material such as polyvinyl alcohol (PVA) or polyvinyl butyral (PVB), and then, the mixture may be applied to or filled into the hole to remove the organic material through a firing process. Here, a plurality of pores may be defined in the ESD protection member 530. For example, the plurality of pores may be defined in an area from which the organic material is volatilized and removed. Also, the ESD protection material may be formed by further mixing a barista material such as ZnO or an insulation ceramic material such as $Al_2O_3$ with the above-described mixed material. Alternatively, various materials in addition to the above-described materials may be used as the ESD protection material. For example, the ESD protection material may use at least one of a porous insulation material and a void. That is, the porous insulation material may be filled into or applied to the hole, and the void may be formed in the hole. Also, a mixed material of the porous insulation material and the conductive material may be filled into or applied to the hole. Also, the porous insulation material, the conductive material, and the void may be formed to form layers within the hole. For example, a porous insulation layer may be disposed between the conductive layers, and the void may be defined between the insulation layers. Here, the void may be formed by connecting the plurality of pores in the insulation layer to each other. Alternatively, the inside of the hole may be empty to form the ESD protection member 530 as a void. Here, ferroelectric ceramic having a dielectric constant of 50 to 50,000 may be used as the porous insulation material. For example, the insulation ceramic may be formed by using a mixture containing at least one of dielectric material powder such as MLCC, ZrO, ZnO, $BaTiO_3$, $Nd_2O_5$, $BaCO_3$, $TiO_2$, Nd, Bi, Zn, and $Al_2O_3$. The porous insulation material may have a porous structure in which a plurality of pores, each of which has a size of approximately 1 nm to approximately 5 µm, are formed to have porosity of 30% to 80%. Here, the shortest distance between the pores may be approximately 1 nm to approximately 5 µm. Also, the conductive material used as the ESD protection material may be formed by using conductive ceramic. The conductive ceramic may use a mixture containing at least one of La, Ni, Co, Cu, Zn, Ru, Ag, Pd, Pt, W, Fe, and Bi. Alternatively, the ESD protection member 530 may be formed as a pore. That is, the ESD protection material 530 may be disposed in an empty space between the first and second internal electrodes 510 and 520. Also, at least one area of the ESD protection member 530 may have a thickness and width different from those of the other area thereof. For example, the ESD protection member 530 may have a predetermined thickness in a Z direction, i.e., a lamination direction of the sheets and a predetermined width in X and Y directions, i.e., a direction in which the first external electrode 4100 is disposed and a direction, in which the second external electrode 420 is disposed, perpendicular to the X and Y directions. Also, an intermediate area of the ESD protection member 530 in a thickness direction may have a width in the X direction, which is greater than that in the Y direction. Also, one cross-sectional area of the ESD protection member 530 may have an oval shape, and thus, the ESD protection member 530 may have an egg shape. In this case, one area of the ESD protection member 530 may have a width or thickness different from that of the other area. Also, the ESD protection member 530 may have a thickness greater than a distance between the coil patterns 310, 320, 330, and 340.

The second internal electrode 520 extending to two sides of the sheet 180, which are opposite to each other, and exposed to the two sides is disposed on a top surface of the sheet 180. That is, the second internal electrode 520 may be disposed in a direction perpendicular to the direction in which the first internal electrode 510 is disposed. Also, the second internal electrode 520 has an expansion part on an area thereof, which at least partially overlaps the ESD protection member 530. That is, the second internal electrode 520 has a first width. Also, the second internal electrode 520 has an expansion part having a second width greater than the first width on an area thereof overlapping the ESD protection member 530, i.e., a portion thereof connected to the ESD protection member 530. The second internal electrode 520 is connected to each of the second external electrodes 4200 (4210 and 4220) disposed on two side surfaces of the laminate 10, which are opposite to each other. Also, the second internal electrode 520 has a predetermined area connected to the ESD protection member 530 disposed on the sheet 170. For this, the area connected to the ESD protection member 530 may have a width greater than that of the other area.

The first and second internal electrodes 510 and 520 of the ESD protection part 3000 may be made of a metal or metal alloy on which porous oxide is formed on a surface thereof.

Figure 2:
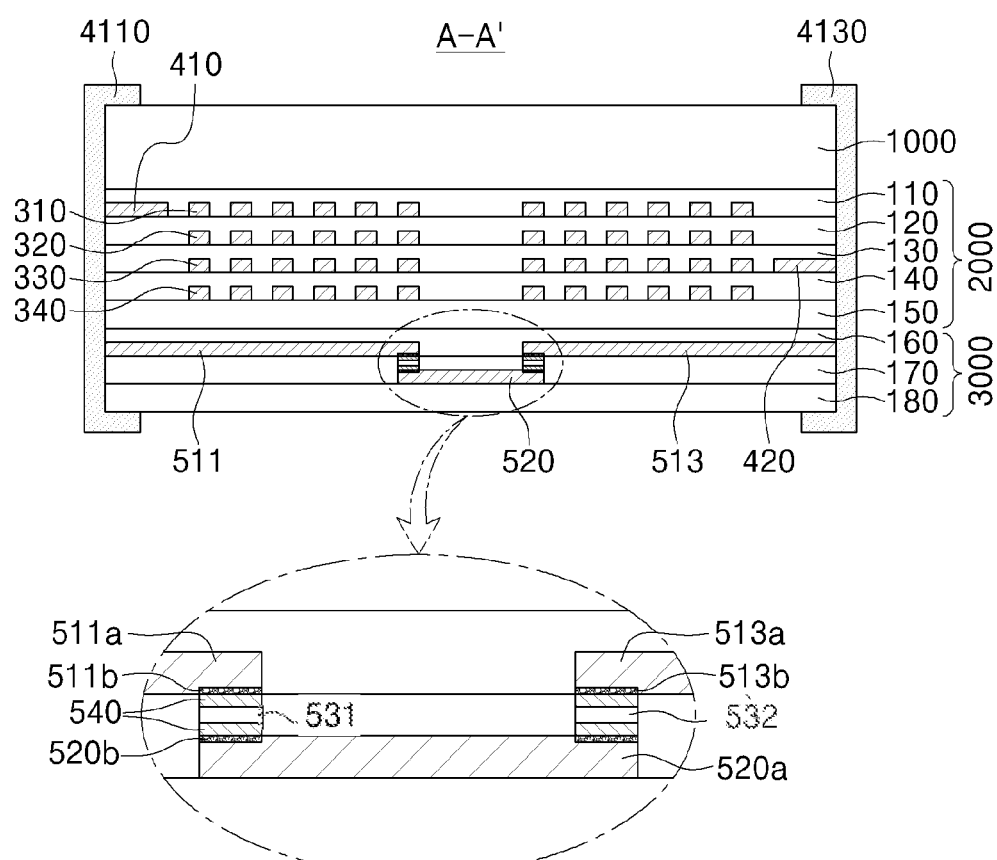
FIGS. 2 to 5 are cross-sectional views of the circuit protection device in accordance with an exemplary embodiment.
Figure 3:
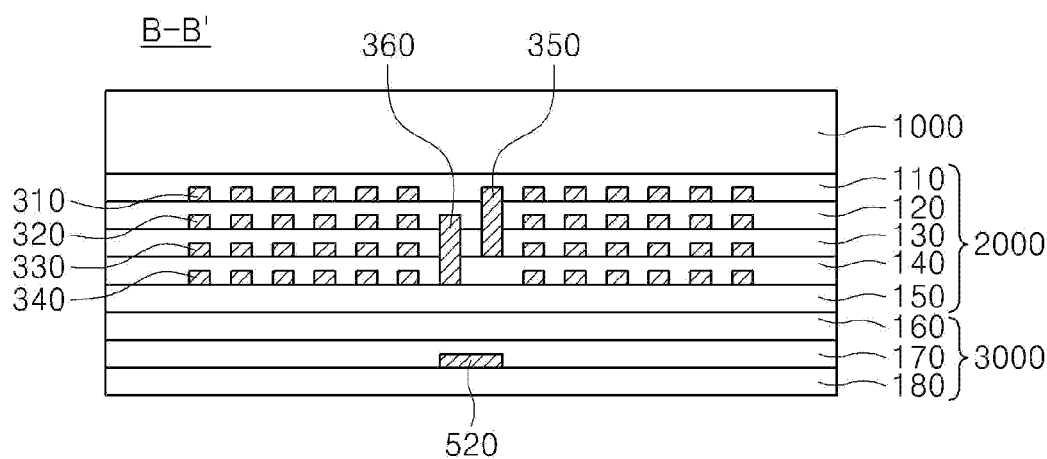
Figure 4:
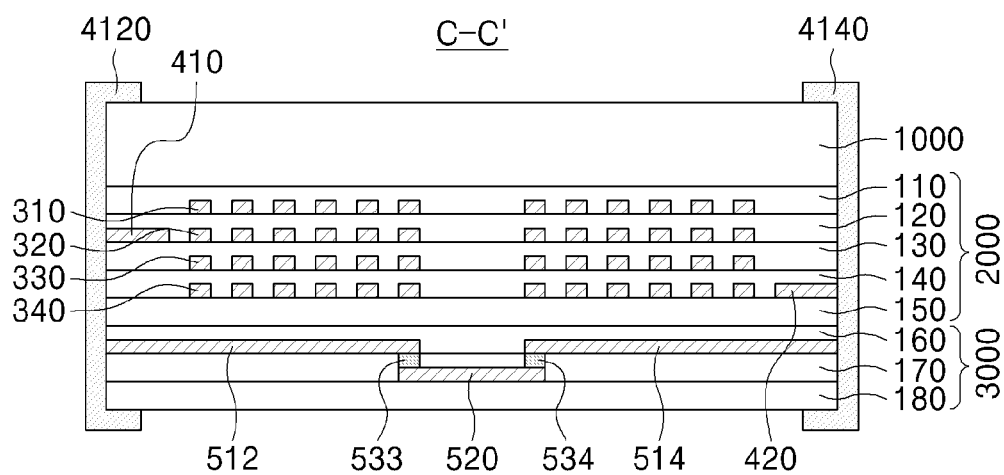
Figure 5:
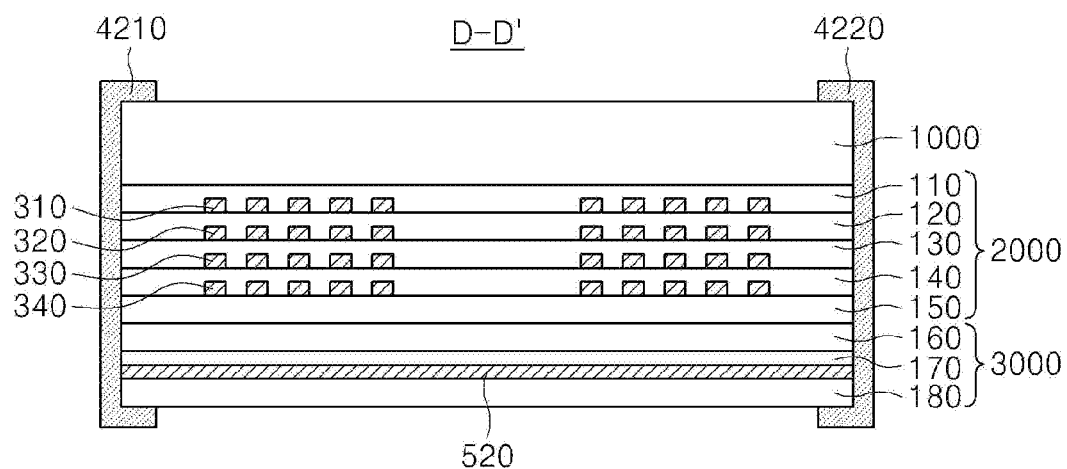

For example, the first and second internal electrodes 510 and 520 may be made of the metal or metal alloy having the porous oxide on the surface thereof. That is, each of the first and second internal electrodes 510 and 520 may include a conductive layer and a porous insulation layer disposed on at least one surface of the conductive layer. Here, the porous insulation layer may be disposed on at least one surface of each of the first and second internal electrodes 510 and 520. That is, the porous insulation layer may be disposed on only one of one surface that does not contact the ESD protection member 530 and the other surface contacting the ESD protection member 530 or be disposed on all of one surface that does not contact the ESD protection member 530 and the other surface contacting the ESD protection member 530. Also, the porous insulation layer may be disposed on an entire surface of at least one surface of the conductive layer or only at least a portion of the at least one surface of the conductive layer. Also, at least one region of the porous insulation layer may be moved, or the porous insulation layer may have a thin thickness. That is, the porous insulation layer may not be disposed on at least one area of the conductive layer, or at least one region of the conductive layer may have a thickness less or greater than that of the other region. Each of the first and second internal electrodes 510 and 520 may be made of Al. This is done because Al is inexpensive when compared to other metals and has conductivity similar to that of each of other metals. Also, $Al_2O_3$ may be formed on a surface of the Al during the firing, and the inside of the Al may be maintained as it is. That is, when the Al is formed on the sheets 170 and 180, the Al may contact air. The surface of the Al may be oxidized during the firing process to form $Al_2O_3$, and the inside of the Al may be maintained as it is. Thus, $Al_2O_3$ may be formed as a thin porous insulation layer on the surface of each of the internal electrodes 510 and 520. Alternatively, various metals may be used to form the insulation layer, i.e., the porous insulation layer, on the surface of the discharge electrode 310 in addition to Al. Thus, when the porous insulation layer is disposed on the surface of each of the first and second internal electrodes 510 and 520, the ESD voltage may be more smoothly discharged. That is, when the ESD protection member 530 includes the porous insulation material, the discharge may be performed through the fine pores. When the porous insulation layer is disposed on the surface of each of the first and second internal electrodes 510 and 520, the number of fine pores in the ESD protection member 530 may more increase to improve discharge efficiency. Also, at least a region of each of the first and second internal electrodes 510 and 520 may be removed or have a thickness different from that of the other region thereof. Although each of the first and second internal electrodes 510 and 520 is partially removed or has a thin thickness, since each of the first and second internal electrodes 510 and 520 is generally connected overall on a plane without being disconnected, electrical properties thereof may not be deteriorated. In FIG. 2, reference numerals 511a and 513a designate the conductive layer of the first internal electrodes 511 and 513, respectively; reference numeral 520a designates the conductive layer of the second internal electrode 520; reference numerals 511b and 513b designate the thin porous insulation layers of the first internal electrodes 511 and 513, respectively; and reference numeral 520b designates the thin porous insulation layer of the second internal electrode 520. In light of the discussion above, it will be appreciated that the first internal electrodes 512 and 514 shown in FIG. 4 would be similarly configured as the first internal electrodes 511 and 513 as shown in FIG. 2, and that the second internal electrode 520 shown in FIG. 4 would be similarly configured as the second internal electrode 520 as shown in FIG. 2.

Also, the ESD protection part 3000 may further include a discharge induction layer 540 between the first and second internal electrodes 510 and 520 and the ESD protection member 530. The discharge induction layer 540 may be formed when the ESD protection member 530 is made of the porous insulation material. Here, the discharge induction layer 540 may be formed as a dielectric layer having density greater than that of the ESD protection member 530. That is, the discharge induction layer 540 may be made of the conductive material or the insulating material. For example, when the ESD protection member 520 is formed by using porous ZrO, and each of the first and second internal electrodes 510 and 520 is formed by using Al, the discharge induction layer 540 made of AlZrO may be disposed between the ESD protection member 530 and the first and second internal electrodes 510 and 520. TiO instead of ZrO may be used for forming the ESD protection member 530. In this case, the discharge induction layer 540 may be made of TiAlO. The discharge induction layer 540 may be formed through reaction between the first and second internal electrodes 510 and 520 and the ESD protection member 530. Alternatively, the discharge induction layer 540 may be formed by additional reaction of the sheets 170 and 180. In this case, the discharge induction layer 540 may be formed by reaction between an internal electrode material (e.g., Al), an ESD protection member material (e.g., ZrO), and a sheet material (e.g., LTCC material). The discharge induction layer 540 may be formed during the firing process. That is, when the firing process is performed at a predetermined temperature, the internal material and the ESD protection material may be mutually diffused to form the discharge induction layer 540 between the discharge electrodes 510 and 520 and the ESD protection member 530. The ESD voltage may be induced to the ESD protection member 530 by the discharge induction layer 540 or may reduce a level of discharge energy induced to the ESD protection member 530. Thus, the ESD voltage may be more easily discharged to improve the discharge efficiency. Also, since the discharge induction layer 540 is formed, a heterogeneous material may be prevented from being diffused to the ESD protection member 530. That is, the diffusion of the insulation sheet material and the internal electrode material to the ESD protection member 530 may be prevented, and the diffusion of the ESD protection material to the outside may be prevented. Thus, the discharge induction layer 540 may be used as a diffusion barrier to prevent the ESD protection member 530 from being broken.

External Electrode

The first external electrode 4100 may be disposed on each of a first side surface of the laminate 10 and a second side surface opposite to the first side surface. Alternatively, two first external electrodes 4100 may be disposed on each of the first and second side surfaces. The first external electrode 4100 may be connected to each of the lead-out electrode 400 of the noise filter part 2000 and the first internal electrode 510 of the ESD protection part 3000. That is, a first-1 external electrode 4110 is connected to the first lead-out electrode 410 and the first-1 internal electrode 511, a first-2 external electrode 4120 is connected to the second lead-out electrode 420 and the first-2 internal electrode 512, a first-3 external electrode 4130 is connected to the third lead-out electrode and the first-3 internal electrode 513, and a first-4 external electrode 4140 is connected to the fourth lead-out electrode 440 and the first-4 internal electrode 514. Also, each of the first external electrodes 4000 may be connected between an input terminal and an output terminal. For example, the first-1 and first-2 external electrodes 4110 and 4120 disposed on one side surface of the circuit protection device may be connected to the signal input terminal, and the first-3 and first-4 disposed on the other side surface corresponding to the one side surface may be connected to the output terminal, for example, a system.

The second external electrode 4200 may be disposed on each of third and fourth side surfaces facing each other of the laminate 10, on which the first external electrode 4100 is not disposed. The second external electrode 4200 may be connected to the second internal electrode 520 of the ESD protection part 3000. That is, a second-1 and second-2 external electrodes 4210 and 4220 may be respectively disposed on the third and fourth side surfaces of the laminate 10 and connected to the second internal electrode 520. Also, the second external electrode 4200 may be connected to a ground terminal. Thus, the ESD voltage may be bypassed to the ground terminal.

The first and second external electrodes 4100 and 4200 may be provided as at least one layer. Each of the second external electrodes 4100 and 4200 may be made of a metal layer such as Ag, and at least one plating layer may be disposed on the metal layer. For example, each of the first and second external electrodes 4100 and 4200 may be formed by laminating a cupper layer, an Ni-plated layer, and an Sn- or Sn/Ag-plated layer. Also, each of the first and second external electrodes 4100 and 4200 may be formed by mixing, for example, multicomponent glass frit using $Bi_2O_3$ or $SiO_2$ of 0.5% to 20% as a main component with metal powder. Here, the mixture of the glass frit and the metal powder may be prepared in the form of paste and applied to two surfaces facing each other of the laminate 10. As described above, since the glass frit is contained in the first and second external electrodes 4100 and 4200, adhesion force between the first and second external electrodes 4100 and 4200 and the laminate 10 may be improved, and contact reaction between the lead-out electrode 400 and the first and second external electrodes 510 and 520 may be improved. Also, after the conductive paste containing the glass is applied, at least one plating layer may be disposed to form the first and second external electrodes 4100 and 4200. That is, the metal layer containing the glass may be provided, and the at least one plating layer may be disposed on the metal layer to form the first and second external electrodes 4100 and 4200. For example, in the first and second external electrodes 4100 and 4200, after the layer containing the glass frit and at least one of Ag and Cu is formed, electroplating or electroless plating may be performed to successively form the Ni-plated layer and the Sn-plated layer. Here, the Sn-plated layer may have a thickness equal to or greater than that of the Ni-plated layer. Each of the first and second external electrodes 4100 and 4200 may have a thickness of 2 μm to 100 μm. Here, the Ni-plated layer may have a thickness of 1 μm to 10 μm, and the Sn- or Sn/Ag-plated layer may have a thickness of 2 μm to 10 μm.

The circuit protection device in accordance with an exemplary embodiment may include first and second magnetic layers in which a plurality of magnetic sheets are laminated and a nonmagnetic layer in which a plurality of nonmagnetic sheets are laminated and which is disposed between the first and second magnetic layers. Also, the noise filter part 2000 may be disposed on the nonmagnetic layer, and the ESD protection part 3000 may be disposed on at least one of the first and second magnetic layers. Also, a glassy surface layer may not be formed on the cover layer 1000 and the ESD protection part 3000, i.e., the first and second magnetic layers. Thus, the circuit protection device may be reduced in thickness and thus mounted to correspond to an electronic device that is reduced in size and mounting height.

Figure 7:
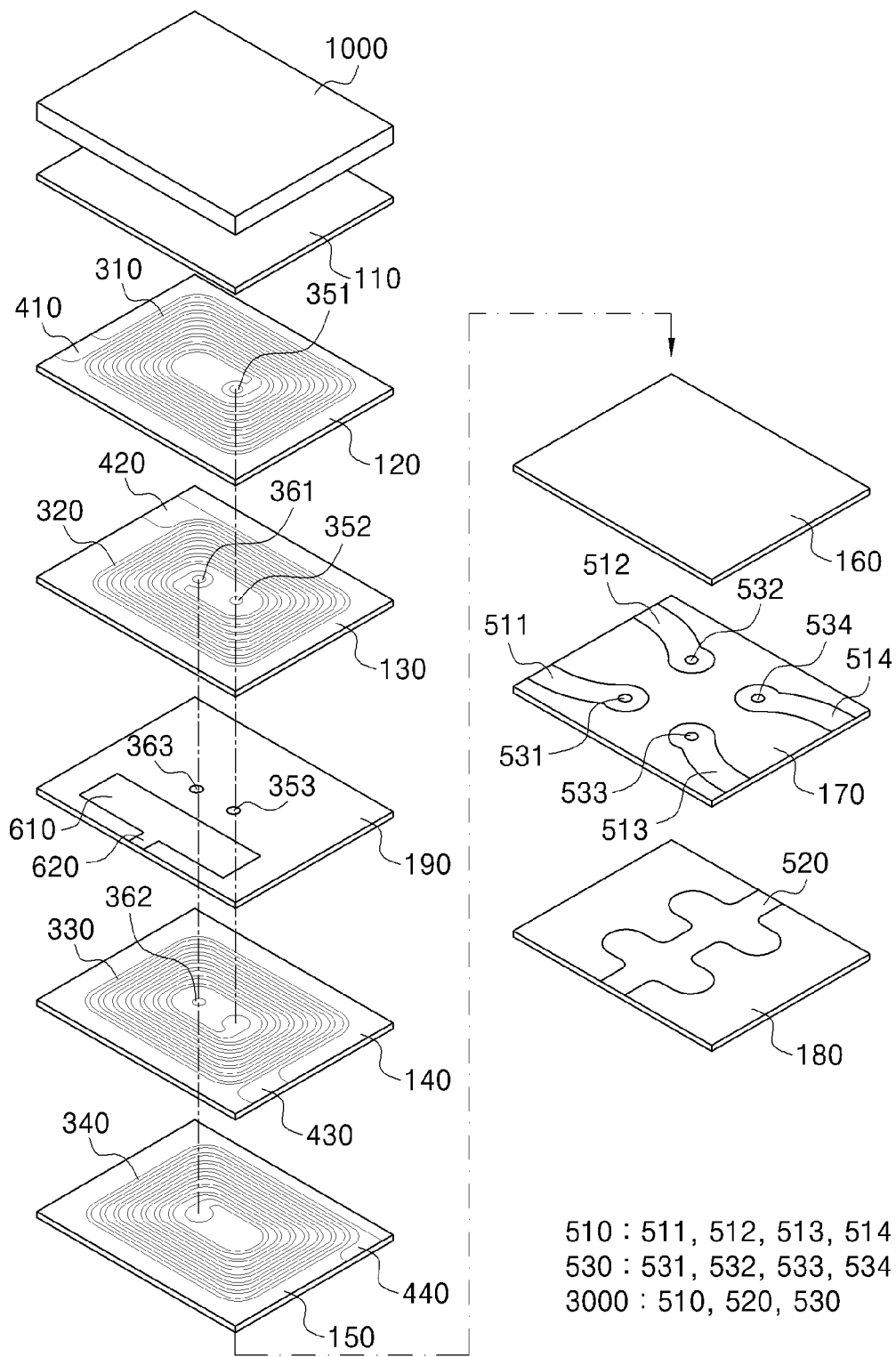
FIG. 7 is an exploded perspective view of a circuit protection device in accordance with another exemplary embodiment.

FIG. 7 is an exploded perspective view of a circuit protection device in accordance with another exemplary embodiment.

Referring to FIG. 7, the circuit protection device in accordance with another exemplary embodiment may include a cover layer 1000, a noise filter part 2000, and an ESD protection part 3000, which are successively disposed downward. Also, a capacitor electrode 610 may be disposed in the noise filter part 2000. That is, a sheet 190 of the capacitor electrode 610 is disposed may be disposed between a sheet 130 on which a second coil pattern of the noise filter part 2000 is disposed and a sheet 190 on which the capacitor electrode 610 is disposed. Since the noise filter part 200 and the ESD protection part 3000 in accordance with another exemplary embodiment are the same as those in accordance with the foregoing embodiment, their detailed descriptions will be omitted, and the capacitor 600 may be mainly described.

Two holes 353 and 363, a capacitor electrode 610, and a lead-out electrode 620 are disposed on the sheet 190. The holes 353 and 363 may be spaced apart from each other in one direction and the other direction, which face each other, from an exact center of the sheet 190. Here, the hole 353 may be defined in the same position as that of the hole 352 of the sheet 130, and the hole 363 may be defined in the same position as that of the hole 361 of the sheet 130. A conductive material may be filled in the holes 353 and 363. For example, the holes 353 and 363 may be filled with paste of a metal material. The holes 353 and 363 are connected to the conductive materials filled into the holes 352 and 361 of the sheet 130, respectively. Thus, the holes 353 and 363 may be portions of vertical connection electrodes 350 and 360, respectively. The capacitor electrode 610 may be spaced apart from the holes 353 and 363 and defined with a predetermined area in at least one area of the sheet 190. An area of the capacitor electrode 610 and an area of the sheet 190 on which the capacitor electrode is not disposed may be provided at a ratio of 1:100 to 100:1. That is, the capacitor electrode 610 may have an area of 1% on the sheet 190 and also be disposed on an entire top surface of the sheet 190 so that the capacitor electrode 610 does not contact the holes 353 and 363. Also, the capacitor electrode 610 may have various shape such as a square shape, a polygonal shape (including a shape having a rounded edge), a circular shape, an oval shape, a spiral shape, and a meander shape. Particularly, the capacitor electrode 610 may have the same shape as that of each of the coil patterns 310, 320, 330, and 340. Capacitors may be respectively disposed between the sheet 190 and the sheet 130 and between the sheet 190 and the sheet 140 by the capacitor electrode 610. That is, two capacitors may be provided. Also, the circuit protection device in accordance with another exemplary embodiment may have capacitance that is adjustable according to an area of the capacitor electrode 610. A portion of the capacitor electrode 610 may be exposed to one side of the sheet 190. For example, a portion of the capacitor electrode 610 may be exposed to one side to form the lead-out electrode 620. The lead-out electrode 620 may be connected to the second external electrode 5210 so that the lead-out electrode 620 is exposed to one short side of the sheet 190.

Figure 8:
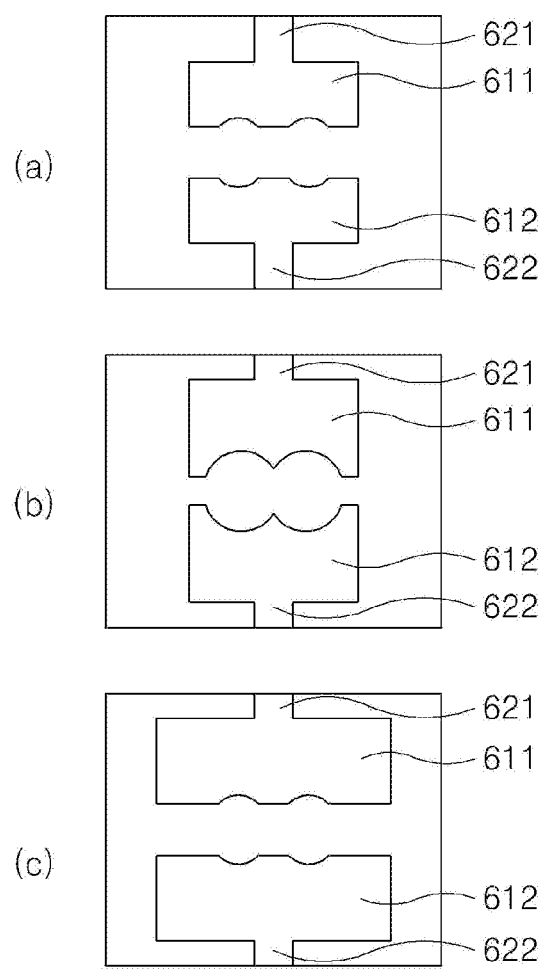
FIGS. 8 and 9 are views illustrating various shapes of a capacitor electrode applied to the circuit protection device in accordance with another exemplary embodiment.

The capacitor electrode may have various shapes. For example, two capacitor electrodes may be disposed to face each other with an area, in which a hole is defined, therebetween. Here, the two electrodes may have shapes that are symmetrical each other. As illustrated in (a) to (c) of FIG. 8, the two capacitor electrodes having shapes symmetrical to each other may be disposed to be spaced a predetermined distance from each other. Here, the two capacitor electrodes 611 and 612 may be spaced apart from each other with the holes 353 and 363 therebetween, and areas of the capacitor electrodes 611 and 612 facing the holes 353 and 363 may be respectively bent along arcs of the holes 353 and 356.

Figure 9:
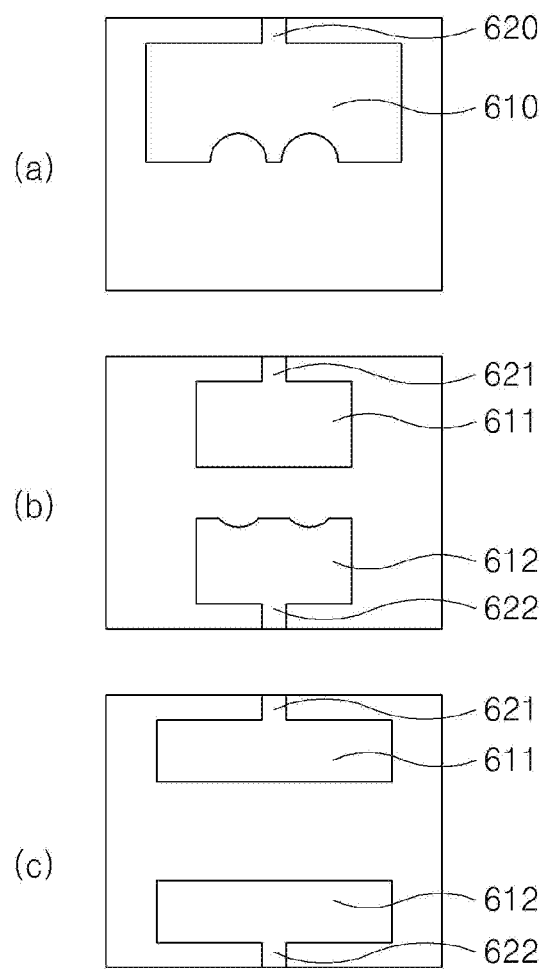

Also, as illustrated in (a) to (c) of FIG. 9, one capacitor electrode may be provided, or two capacitor electrode may be provided. That is, as illustrated in (a) of FIG. 9, one capacitor electrode 610 may be spaced apart from the holes 353 and 363 to surround predetermined areas of the holes 353 and 363. Here, a portion of the capacitor electrode 610 facing the holes 353 and 363 may be bent along the arcs of the holes 353 and 363. Also, as illustrated in (b) of FIG. 9, the two capacitor electrodes 611 and 612 may be disposed to be spaced a predetermined distance from each other with the holes 353 and 363 therebetween. Here, areas of one capacitor electrode 612 facing the holes 353 and 363 may be bent along the arcs of the holes 353 and 356, and each of areas of the other capacitor electrode 612 facing the holes 353 and 363 may have a linear shape. As illustrated in (c) of FIG. 9, a side, which faces each of the hole 353 and 363, of the two capacitor electrodes 611 and 612 disposed to spaced a predetermined distance from each other with the holes 353 and 363 therebetween may have a linear shape.

Figure 10:
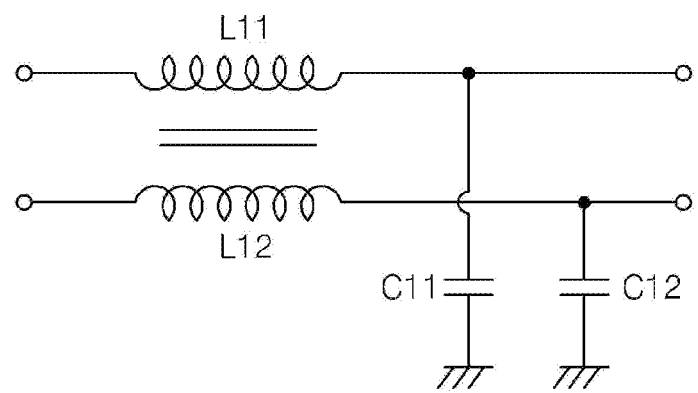
FIG. 10 is an equivalent circuit diagram of the circuit protection device in accordance with another exemplary embodiment.

As described above, in the circuit protection device in accordance with another exemplary embodiment, the capacitor electrode 610 may be disposed between the sheets 130 and 140 to form a first capacitor between the capacitor electrode 610 and the third coil pattern 330 and a second capacitor between the capacitor electrode 610 and the second coil pattern 320. As a result, as illustrated in the equivalent circuit diagram of FIG. 10, the circuit protection device may include first and second inductors L11 and L12 and first and second capacitors C11 and C12 respectively connected to the first and second inductors L11 and L12. That is, the circuit protection device in accordance with another exemplary embodiment may include at least two inductors and at least two capacitors respectively connected to the inductors.

In the circuit protection device in accordance with another exemplary embodiment, the turn number of each of the coil patterns 310, 320, 330, and 340, an area of the capacitor electrode 610, and distances between the coil patterns 310, 320, 330, and 340, i.e., a thickness of each of the sheets may be adjusted to adjust inductance and capacitance, thereby adjusting a suppressible noise of a frequency. For example, if each of the sheets 120, 130, 140, 150, and 160 is reduced in thickness, a noise having a low frequency band may be suppressed. If each of the sheets 120, 130, 140, 150, and 160 increases in thickness, noises of a high frequency band may be suppressed. The circuit protection device including the two inductors and the two capacitors, i.e., a common mode noise filter may suppress noises of two frequency bands.

In frequency characteristics of the circuit protection device in accordance with another exemplary embodiment, two peaks are generated in a frequency band of 1 GHz or more, and thus, the noises of the two frequency bands may be suppressed. However, in a common mode noise filter, which does not include a capacitor, in accordance with the related art, one peak may be generated in the frequency band of 1 GHz, and thus, only a noise of one frequency band may be suppressed. As a result, the circuit protection device in accordance with another exemplary embodiment may suppress noises of at least two frequency bands, and thus, may be used in portable electronic devices such as smartphones, in which various frequencies are adopted, to improve quality of the electronic devices.

Figure 11:
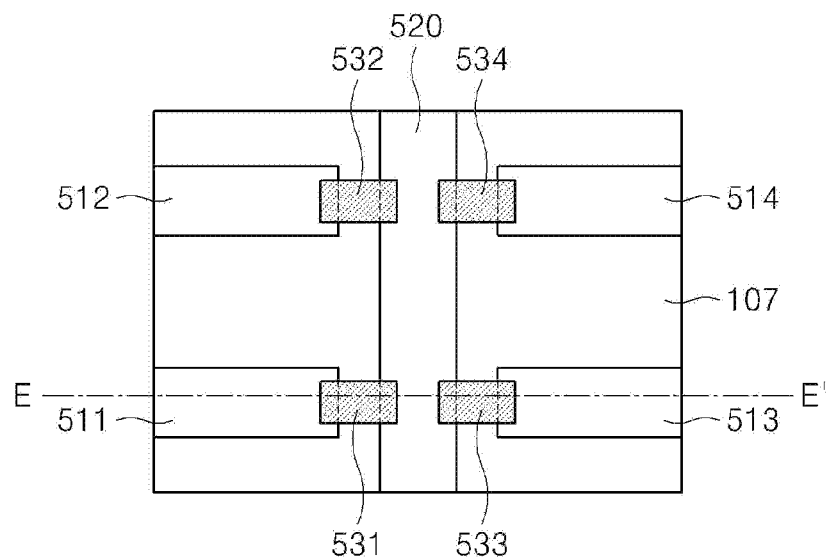
FIGS. 11 and 12 are partial plan and cross-sectional views of a circuit protection device in accordance with further another exemplary embodiment.
Figure 12:
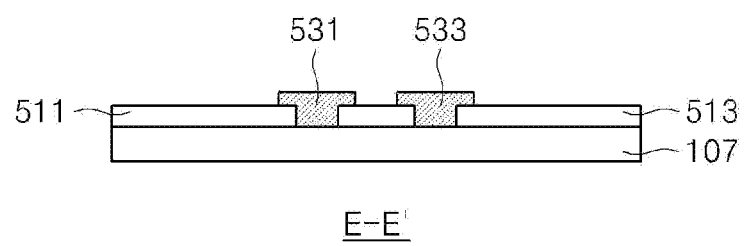

In the foregoing embodiments, the ESD protection part 300 includes the first and second internal electrodes 510 and 520, which are vertically spaced apart from each other, and the ESD protection member 530 disposed between the first and second internal electrodes 510 and 520. However, the ESD protection member 530 may be disposed so that the first and second internal electrodes 510 and 520 are horizontally disposed on the same sheet and partially overlap the first and second internal electrodes 510 and 520. That is, as illustrated in FIGS. 11 and 12, the first and second internal electrodes 510 and 520 and the ESD protection member 530 may be disposed on the same plane to realize the ESD protection part 3000. Here, FIG. 11 is a plan view of one sheet 107 on which an ESD protection part 3000 is disposed in accordance further another exemplary embodiment, and FIG. 12 is a cross-sectional view taken along line E-E' of FIG. 11. Since a noise filter part 2000 may have one of the structures described with reference to FIGS. 1 to 6 and the structure described with reference to FIGS. 7 to 10 in accordance with the foregoing embodiments, its detailed description and illustration will be omitted.

As illustrated in FIGS. 11 and 12, a plurality of first internal electrodes 510 (511, 512, 513, and 514) may be disposed to be spaced apart from each other on one sheet 107 made of a magnetic material. Here, since the plurality of first internal electrodes 510 are respectively connected to a plurality of first external electrodes 4100, ends of the first internal electrodes 510 may be exposed to a surface on which the first external electrodes 4100 are disposed. Also, the second internal electrodes 520 may be disposed to be spaced apart from the plurality of first internal electrodes 510 on the same plane as the plurality of first internal electrodes 510. Here, since the second internal electrode is connected to a second external electrode 4200, one end and the other end of the second internal electrode 520 may be exposed to a surface on which the second external electrode 4200 is disposed. Also, a plurality of ESD protection members 530 (531, 532, 533, and 534) are disposed between the plurality of first internal electrodes 510 and the second internal electrode 520. That is, the plurality of ESD protection members 530 may be disposed on a sheet between the first and second internal electrodes 510 and 520, and at least a portion of the ESD protection members may overlap the first and second internal electrodes 510 and 520. Here, the ESD protection members 530 different from each other are disposed on the second internal electrode 520 so that the ESD protection members 530 do not come into contact with each other.

Figure 13:
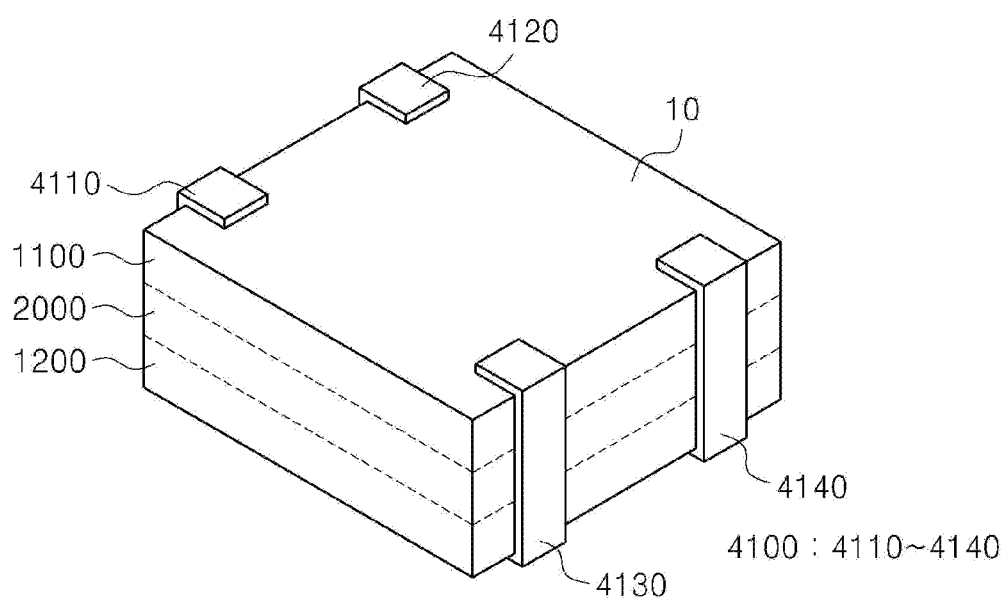
FIGS. 13 and 14 are coupling perspective and exploded views of a circuit protection device in accordance with still another exemplary embodiment.
Figure 14:
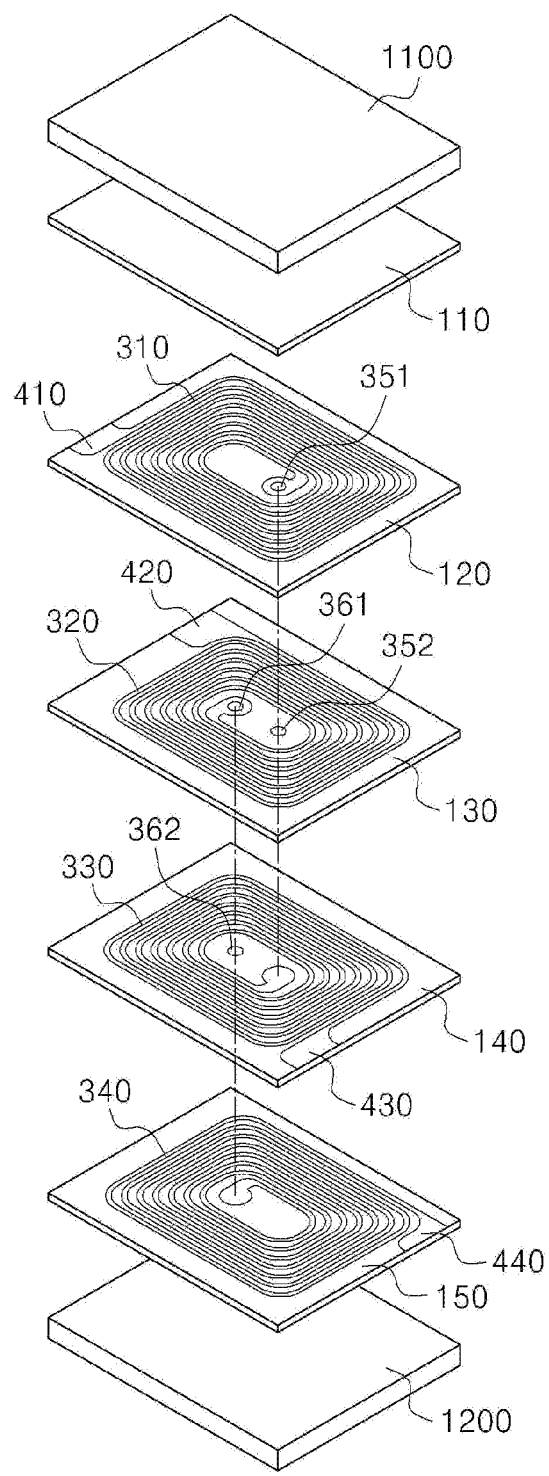

FIG. 13 is a perspective view of a circuit protection device in accordance with still another exemplary embodiment, and FIG. 14 is an exploded perspective view.

Referring to FIGS. 13 and 14, a circuit protection device in accordance with still another exemplary embodiment may include a noise filter part 2000 and cover layers 1100 and 1200 respectively disposed on upper and lower portions of the noise filter part 2000. That is, the circuit protection device in accordance with still another exemplary embodiment may include only a noise filter part without including an ESD protection part. Here, the cover layers 1100 and 1200 may be disposed on the upper and lower portions of the noise filter part 2000. That is, the first cover layer 1100, the noise filter part 2000, and the second cover layer 1200 may be successively disposed downward. Here, the noise filter part 1000 may be formed by laminating the plurality of coil patterns as described in accordance with an exemplary embodiment, and at least two coil patterns may be connected to each other to form at least two inductors. In addition, as described in another exemplary embodiment, the capacitor may be disposed in the noise filter part 2000. Also, each of the first and second cover layers 1100 and 1200 may be provided as a magnetic sheet, and the noise filter part 2000 may be provided as a nonmagnetic sheet.

Although the coil patterns 310, 320, 330, and 340 of the noise filter part 2000 are respectively disposed on the sheets in accordance with the foregoing embodiments, two or more coil patterns may be disposed on one sheet. For example, two coil patterns may be disposed to be spaced apart from each other on one sheet, and three coil patterns may be disposed to be spaced apart from each other on one sheet. The plurality of coil patterns spaced apart from each other may be vertically connected to each other to constitute an inductor. Here, the coil patterns disposed on the same sheet may have the same turn number or turn numbers different from each other. When the coil patterns have the same turn number, a plurality of inductors having the same inductance may be realized. When the coil patterns have turn numbers different from each other, a plurality of inductors having at least two inductances different from each other may be realized. Thus, a plurality of inductors may be realized in one circuit protection device. Also, the ESD protection part may be disposed on a lower side and/or an upper side of the noise filter part 2000. Alternatively, the ESD protection part may not be provided, and the cover layer may be disposed on the upper and lower sides of the noise filter part 2000.

Figure 15:
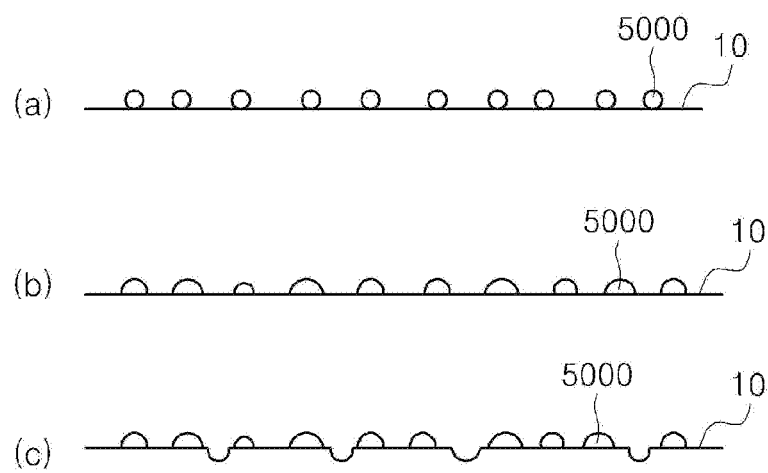
FIG. 15 is a schematic cross-sectional view illustrating a surface of a circuit protection device in accordance with even another exemplary embodiment.

Also, before the first and second external electrodes 4100 and 4200 are formed, oxide may be distributed on a surface of a laminate 10 to form an insulation member 5000. That is, as illustrated in FIG. 15, the insulation member 5000 may be disposed on the surface of the laminate 10. Here, the laminate 10 may be formed by laminating nonmagnetic sheets or by laminating the nonmagnetic sheets with a magnetic sheet therebetween. That is, the insulation member 5000 may be formed on the surface of the laminate 10 that realizes circuit protection devices having various shapes. Also, in the insulation member 5000, oxide having a crystal state or an amorphous state may be dispersed and distributed on the surface of the laminate 10. The oxide may be distributed before a portion of each of the external electrodes 4100 and 4200 is formed through the printing process or distributed before the plating process is performed. That is, the oxide may be distributed on the surface of the laminate 10 before the plating process when the external electrodes 4100 and 4200 are formed through the plating process. At least a portion of the oxide distributed on the surface may be melted. Thus, the insulation member 5000 may be formed before the first and second external electrodes 4100 and 4200 are formed and also be formed on the surface of the laminate 10. Here, at least a portion of the oxide may be uniformly distributed on the surface of the laminate 10 as illustrated in (a) of FIG. 15, or at least a portion of the oxide may be non-uniformly disposed with sizes different from each other as illustrated in (b) FIG. 15. Also, as illustrated in (c) of FIG. 15, a recess part may be defined in at least a portion of the surface of the laminate 10. That is, the oxide may be formed to form a protrusion part, and at least a portion of an area on which the oxide is not formed may be recessed to form the recess part. Since the oxide is distributed before the plating process, the surface of the laminate 10 may be deformed, and thus, resistance on the surface of the laminate 10 may be uniform. Thus, the plating process may be uniformly performed, and thus, the external electrode may be controlled in shape. That is, the resistance on at least an area of the surface of the laminate 10 may be different from that on the other area of the surface of the laminate 10. When the plating process is performed in a state in which the resistance is non-uniform, the plating process may be well performed on an area having relatively low resistance than an area having relatively high resistance to cause ununiformity in growth of the plating layer. Thus, to solve the above-described limitation, the surface resistance of the laminate 10 has to be uniformly maintained. For this, the oxide having the particle or molten state may be dispersed on the surface of the laminate 10 to form the insulation member 5000. Here, the oxide may be partially distributed on the surface of the laminate 10. Alternatively, the oxide may be distributed in the form of the layer on at least one area and partially distributed on at least one area. For example, as illustrated in (a) of FIG. 15, the oxide may be distributed in an island shape on the surface of the laminate 10 to form the insulation member 5000. That is, the oxide that is in the crystal or amorphous state may be disposed to be spaced apart from each other and distributed in the island shape on the surface of the laminate 10. Thus, at least a portion of the surface of the laminate 10 may be exposed. Also, the oxide may be formed on the form of the layer on the at least one area and distributed in the island shape on at least a portion of the surface of the laminate 10. That is, at least two oxides may be connected to each other to form the layer on at least one area and the island shape on at least one area. Thus, at least a portion of the surface of the laminate 10 may be exposed by the oxide, i.e., the insulation member 5000. The total area of the insulation member 500, which is made of the oxide distributed in the island shape on the at least a portion of the surface of the laminate 10 may be, for example, 10% to 90% of the total area of the surface of the laminate 10. Here, at least one oxide may be used as the oxide, which is in the particle or molten state, for realizing the uniform surface resistance of the laminate 10. For example, at least one of $Bi_2O_3$, $BO_2$, $B_2O_3$, $ZnO$, $Co_3O_4$, $SiO_2$, $Al_2O_3$, $MnO$, $H_2BO_3$, $H_2BO_3$, $Ca(CO_3)_2$, $Ca(NO_3)_2$, and $CaCO_3$ may be used as the oxide.

As described above, the technical idea of the present invention has been specifically described with respect to the above embodiments, but it should be noted that the foregoing embodiments are provided only for illustration while not limiting the present invention. Various embodiments may be provided to allow those skilled in the art to understand the scope of the preset invention, but the present invention is not limited thereto.

The invention claimed is:

1. A circuit protection device, comprising:
   a first magnetic layer in which a plurality of magnetic sheets are laminated and of which at least a portion of one surface is exposed;
   a second magnetic layer in which a plurality of magnetic sheets are laminated and of which at least a portion of one surface is exposed;
   a nonmagnetic layer in which a plurality of nonmagnetic sheets are laminated and which is disposed between the first and second magnetic layers;
   a noise filter part disposed in the nonmagnetic layer, wherein the noise filter part includes a plurality of coil patterns; and
   an ESD protection part comprising first and second internal electrodes disposed in at least one of the first and second magnetic layer, and an ESD protection member disposed between the first and second internal electrodes, wherein each of the first and second internal electrodes is formed as a conductive layer having a porous insulation layer formed on a surface thereof, and wherein the ESD protection member is made of a porous insulating material.

2. The circuit protection device of claim 1, wherein a thickness of the first magnetic layer is different from a thickness of at least one of the second magnetic layer and the nonmagnetic layer.

3. The circuit protection device of claim 2, wherein at least two of the plurality of magnetic sheets have different thicknesses or at least two of the plurality of nonmagnetic sheets have different thicknesses.

4. The circuit protection device of claim 3, wherein the noise filter part further comprises a plurality of lead-out electrodes and a plurality of connection electrodes, wherein each connection electrode is configured to connect at least two coil patterns.

5. The circuit protection device of claim 4, wherein at least two coil patterns connected to each by a common connection electrode are disposed on different nonmagnetic sheets constitute part of the same inductor, and the circuit protection device includes at least two inductors.

6. The circuit protection device of claim 5, wherein the first and second internal electrodes are vertically spaced apart from each other, and the ESD protection member is disposed between the first and second internal electrodes.

7. The circuit protection device of claim 5, wherein the first and second internal electrodes are horizontally spaced apart from each other, and the ESD protection member is disposed between the first and second internal electrodes.

8. The circuit protection device of claim 6, further comprising a discharge induction layer between the first and second internal electrodes and the ESD protection member.

9. The circuit protection device of claim 5, wherein a distance between a selected coil pattern of the plurality of coil patterns and the first and second internal electrodes adjacent to the selected coil pattern is equal to or greater than that between two adjacent coil patterns of the plurality of coil patterns.

10. The circuit protection device of claim 5, further comprising at least one nonmagnetic sheet which is disposed between at least two coil patterns and on which at least one capacitor electrode is disposed.

11. The circuit protection device of claim 1, wherein the first and second magnetic layers and the nonmagnetic layer forms a laminate, the circuit protection device further comprising an insulation member disposed on a surface of the laminate to expose at least a portion of the surface of the laminate.

12. The circuit protection device of claim 11, further comprising a recess part defined in at least a portion of the surface of the laminate.

13. The circuit protection device of claim 11, wherein the insulation member is made of oxide having a crystal state or amorphous state.

14. The circuit protection device of claim 13, wherein the oxide comprises at least one of $Bi_2O_3$, $BO_2$, $B_2O_3$, $ZnO$, $Co_3O_4$, $SiO_2$, $Al_2O_3$, $MnO$, $H_2BO_3$, $H_2BO_3$, $Ca(CO_3)_2$, $Ca(NO_3)_2$, and $CaCO_3$.

* * * * *